United States Patent
Nagasaka

(10) Patent No.: US 10,292,312 B2
(45) Date of Patent: May 14, 2019

(54) ELECTRONIC APPARATUS AND SERVER

(71) Applicant: NEC Corporation, Tokyo (JP)

(72) Inventor: Yorito Nagasaka, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/448,235

(22) Filed: Mar. 2, 2017

(65) Prior Publication Data

US 2017/0273220 A1 Sep. 21, 2017

(30) Foreign Application Priority Data

Mar. 18, 2016 (JP) .................................. 2016-055135

(51) Int. Cl.
*H05K 7/20* (2006.01)

(52) U.S. Cl.
CPC ................................ *H05K 7/20736* (2013.01)

(58) Field of Classification Search
CPC .................................................. H05K 7/20736
See application file for complete search history.

(56) References Cited

U.S. PATENT DOCUMENTS

| 9,578,786 B1* | 2/2017 | Beall ................. H05K 7/20754 |
| 2013/0083481 A1* | 4/2013 | Goto .................. H05K 7/20209 361/695 |
| 2014/0036442 A1* | 2/2014 | Giannoglou ........... H05K 7/186 361/695 |

FOREIGN PATENT DOCUMENTS

| JP | H4-259291 A | 9/1992 |
| JP | H7-254794 A | 10/1995 |
| JP | H7-283569 A | 10/1995 |
| JP | H11-40970 A | 2/1999 |
| JP | 2001-189584 A | 7/2001 |
| JP | 2009-158544 A | 7/2009 |
| JP | 2009158544 A * | 7/2009 |
| JP | 2014-117011 A | 6/2014 |
| JP | 2015-179714 A | 10/2015 |

OTHER PUBLICATIONS

Japanese Office Action issued by the Japan Patent Office for Japanese Application No. 2016-055135 dated May 9, 2017 (7 pages).

* cited by examiner

*Primary Examiner* — David M Sinclair
*Assistant Examiner* — Robert D Brown
(74) *Attorney, Agent, or Firm* — Wilmer Cutler Pickering Hale and Dorr LLP

(57) ABSTRACT

An electronic apparatus includes: a fan which flows cooling air in a flow passage; a plurality of modules which are arranged in the flow passage, the modules including first and second modules, the first and second modules being aligned with a flow direction of the cooling air; and a support member that supports the first module, and makes a portion of the first module protrude further than the second module in a direction approximately orthogonal to the flow direction.

8 Claims, 7 Drawing Sheets

ELECTRONIC APPARATUS AND SERVER

This application is based upon and claims the benefit of priority from Japanese patent application No. 2016-055135, filed on Mar. 18, 2016, the disclosure of which is incorporated herein in its entirety by reference.

BACKGROUND OF THE INVENTION

Field of the Invention

The present invention relates to an electronic apparatus and a server.

Description of Related Art

Known is an electronic apparatus installable with a plurality of modules. In this type of electronic apparatus, a heat-generating body such as a CPU (Central Processing Unit) is often mounted on a module, and the module is cooled by feeding cooling air using a common fan.

Japanese Unexamined Patent Application, First Publication No. H11-40970 (referred to as Patent Document 1 below) discloses a technique in which a flow of cooling air is made a straight line by providing a fan on an inlet side and an exhaust side.

However, if modules are arranged to be aligned on the inlet side and the exhaust side of the cooling air, the cooling air that has been heated due to heat exchange at the inlet-side module is then supplied as the cooling air to the exhaust-side module. Consequently, the temperature of the exhaust-side module becomes higher than that of the inlet-side module.

Japanese Unexamined Patent Application, First Publication No. 2014-117011 (referred to as Patent Document 2 below) discloses a technique that reduces thermal interference between proximally-arranged power modules and prevents an air flow from directly hitting a downstream-side power module. Patent Document 2 discloses a structure in which the height of a heatsink is made a step form, and a cooling air flow is drawn in from an aperture formed in a step portion thereof.

However, in the technique disclosed in Patent Document 2, it is necessary to prepare a heatsink having a different height. Consequently, there is a possibility of an increase in the types of components leading to an increase in cost.

SUMMARY OF THE INVENTION

The present invention takes into consideration the above circumstances. An exemplary object of the present invention is to provide an electronic apparatus and a server in which it is possible to more uniformly cool a plurality of modules that are aligned with a flow direction of cooling air, while inhibiting cost increases.

An electronic apparatus according to an exemplary aspect of the present invention includes: a fan which flows cooling air in a flow passage; a plurality of modules which are arranged in the flow passage, the modules including first and second modules, the first and second modules being aligned with a flow direction of the cooling air; and a support member that supports the first module, and makes a portion of the first module protrude further than the second module in a direction approximately orthogonal to the flow direction.

A server according to an exemplary aspect of the present invention includes: the above-described electronic apparatus; and a casing that houses the modules, and forms the flow passage.

In the electronic apparatus and the server mentioned above, it becomes possible to more uniformly cool a plurality of modules that are arranged to be aligned with a flow direction of cooling air, while inhibiting cost increases.

EXEMPLARY EMBODIMENT

Hereunder, a plurality of exemplary embodiments of the present invention are described with reference to the drawings.

First Exemplary Embodiment

Figure 1:
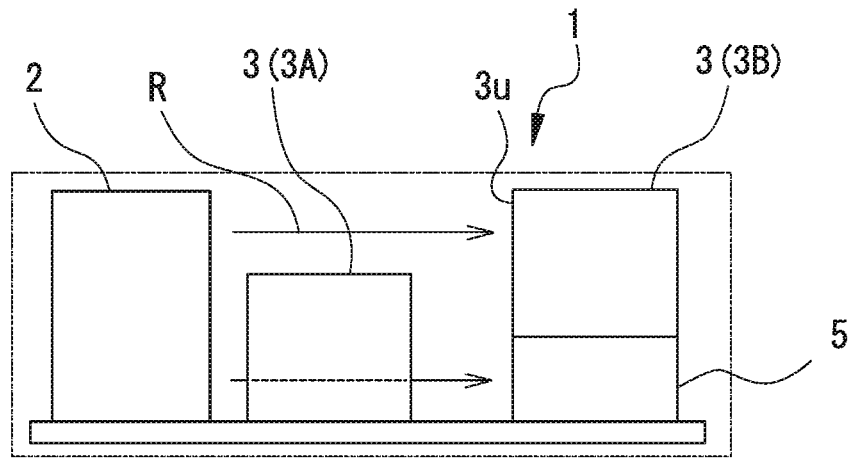
FIG. 1 is a side cross-sectional view showing a configuration of an electronic apparatus in a first exemplary embodiment of the present invention.

FIG. 1 is a side cross-sectional view showing a configuration of an electronic apparatus 1 in a first exemplary embodiment of the present invention.

As shown in FIG. 1, the electronic apparatus 1 includes a fan 2, a plurality of modules 3, and a support member 5.

The fan 2 delivers cooling air to the plurality of modules 3, and cools the respective modules 3.

The plurality of modules 3 are arranged on a flow passage R of the cooling air.

The support member 5 supports at least either the module 3A or the module 3B. Here the support member 5 supports the module 3B, which is one of the plurality of modules 3, such that it protrudes in a direction that is approximately orthogonal to the flow passage R with respect to the other module 3A of the plurality of modules 3.

Here, for example, the support member 5 is provided on the lower side of the module 3B, which is arranged in the flow passage R of the cooling air and on the cooling air flow direction downstream side. In this manner, in contrast to the module 3A, which is arranged in the flow passage R and on the cooling air flow direction upstream side, the module 3B supported by the support member 5, which is arranged on the flow direction downstream side, has an upper portion $3u$ representing a portion thereof that protrudes in a direction (upward in the example of FIG. 1) that is approximately orthogonal to the flow passage R.

According to the first exemplary embodiment described above, as a result of being supported by the support member 5, the upper portion 3u representing a portion of the module 3B can be made to protrude further than the module 3A in a direction that is approximately orthogonal to the flow passage R. Consequently, it is possible for the upper portion 3u, which in the module 3B protrudes in a direction that is approximately orthogonal to the flow passage R, to make contact with cooling air having a low temperature that has not been used for cooling the module 3A.

As a result, it becomes possible to more uniformly cool the plurality of modules 3. Therefore, it is possible to inhibit increases in the types of modules 3 and to inhibit cost increases.

(Modification of First Exemplary Embodiment)

In the first exemplary embodiment, the module 3B in the flow passage R and on the cooling air flow direction downstream side is supported by the support member 5. However, an exemplary embodiment is in no way limited to this.

Figure 2:
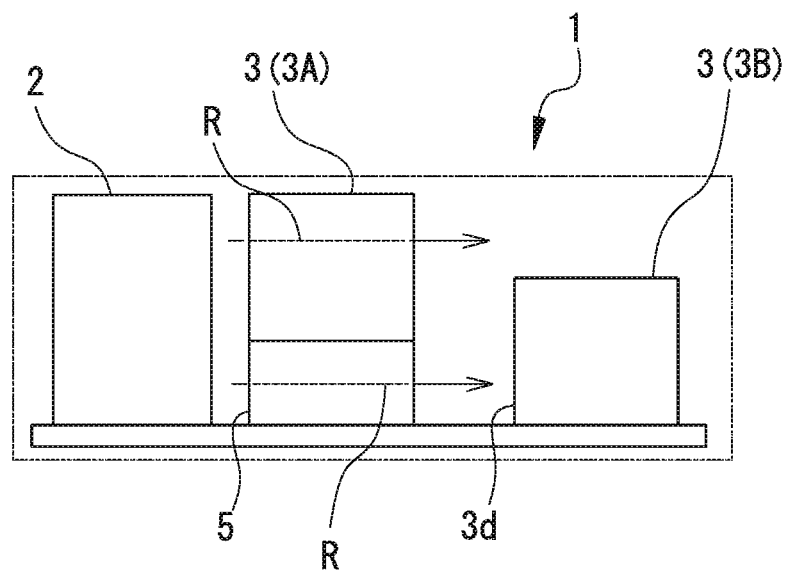
FIG. 2 is a side cross-sectional view showing a configuration of an electronic apparatus in a modification of the first exemplary embodiment of the present invention.

FIG. 2 is a side cross-sectional view showing a configuration of an electronic apparatus in a modification of the first exemplary embodiment of the present invention.

As shown in FIG. 2, for example, the module 3A in the flow passage R and on the cooling air flow direction upstream side may be supported by the support member 5. In such a manner, a lower portion 3d representing a portion of the module 3B can be made to downwardly protrude further than the module 3A in a direction that is approximately orthogonal to the flow passage R.

In this case, the cooling air that flows in the vicinity of the support member 5 supporting the module 3A, which is positioned on the flow direction upstream side, is not heated by the module 3A. Therefore, in the same manner as in the first exemplary embodiment, the module 3B that is positioned on the flow direction downstream side can be efficiently cooled by the cooling air.

Second Exemplary Embodiment

Next, a second exemplary embodiment of the present invention is described with reference to the drawings. The second exemplary embodiment is an exemplary embodiment of a server including the electronic apparatus of the first exemplary embodiment mentioned above. Consequently, in the second exemplary embodiment, the same sections as in the first exemplary embodiment are described using the same reference symbols, and duplicate explanations are omitted.

Figure 3:
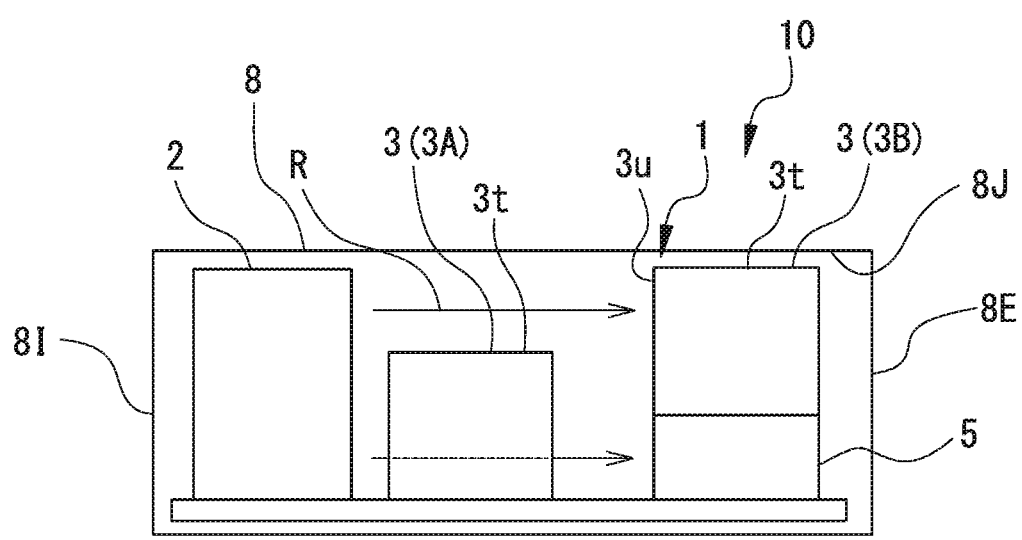
FIG. 3 is a side cross-sectional view showing a configuration of a server in a second exemplary embodiment of the present invention.

FIG. 3 is a side cross-sectional view showing a configuration of a server 10 in the second exemplary embodiment of the present invention.

As shown in FIG. 3, the server 10 includes an electronic apparatus 1 and a casing 8. The casing 8 has, for example, a rectangular parallelepiped shape, and accommodates the electronic apparatus 1 in the interior thereof.

The electronic apparatus 1 includes, in the same manner as in the first exemplary embodiment, a fan 2, a plurality of modules 3, and a support member 5.

The plurality of modules 3 are arranged in the flow passage R of the cooling air. The plurality of modules 3 in the second exemplary embodiment each have the same height.

The support member 5 supports the module 3B, which represents one (a portion) of the plurality of modules 3. The support member 5 supports the module 3B representing a portion of the plurality of modules 3 such that it protrudes in a direction that is approximately orthogonal to the flow passage R with respect to the module 3A, which represents the other module of the plurality of modules 3. Here, for example, the support member 5 supports from the lower side, among the plurality of modules 3, the module 3B that is arranged on the side near an exhaust port 8E of the casing 8. Consequently, the module 3B supported by the support member 5, which is arranged on the side near the exhaust port 8E, has an upper portion 3u representing a portion thereof that protrudes in a direction (upward in the example of FIG. 2) that is approximately orthogonal to the flow passage R, with respect to the module 3A arranged on the side near an inlet port 8I of the casing 8. In this manner, the upper end portions 3t of the plurality of modules 3 are such that the closer a module 3 is to the exhaust port 8E, the more the upper end portion 3t thereof approaches the upper wall portion (upper wall) 8J of the casing 8 that forms the flow passage R. Here, since the module 3B is closer to the exhaust port 8E than the module 3A, the upper end portion 3t of the module 3B is closer to the upper wall portion 8J than the upper end portion 3t of the module 3A.

According to the second exemplary embodiment described above, as a result of being supported by the support member 5, the upper portion 3u of the module 3B protrudes further than the module 3A in a direction that is approximately orthogonal to the flow passage R. Consequently, it is possible to deliver to the upper portion 3u, which of the module 3B protrudes in a direction that is approximately orthogonal to the flow passage R, cooling air having a low temperature that has not been used for cooling the module 3A arranged further on the upstream side than the module 3B.

Further, the upper end portions 3t of the plurality of modules 3 are such that the closer a module 3 is to the exhaust port 8E, the closer it becomes to the upper wall portion 8J of the casing 8. Therefore, the space of the flow passage R formed by the casing 8, wherein cooling air flows from the inlet port 8I toward the exhaust port 8E, can be efficiently used.

Consequently, it becomes possible to more efficiently cool the plurality of modules 3.

Further, without changing the height dimension of the module 3 itself and while using modules 3 having the same height dimension, it is possible for an upper portion 3u, which represents a portion of the module 3, to protrude in a direction that is approximately orthogonal to the flow passage R by using the support member 5. Therefore, it is possible to inhibit increases in the types of modules 3 and to inhibit cost increases.

In the second exemplary embodiment, a case where the plurality of modules 3 has the same height dimension is described. However, as long as it is possible for a portion of the module 3A or a portion of the module 3B to protrude relative to the other in a direction that is approximately orthogonal to the flow passage R, it is not necessary for the plurality of modules 3 to have the same height dimension.

Third Exemplary Embodiment

Next, a third exemplary embodiment of the present invention is described with reference to the drawings.

Figure 4:
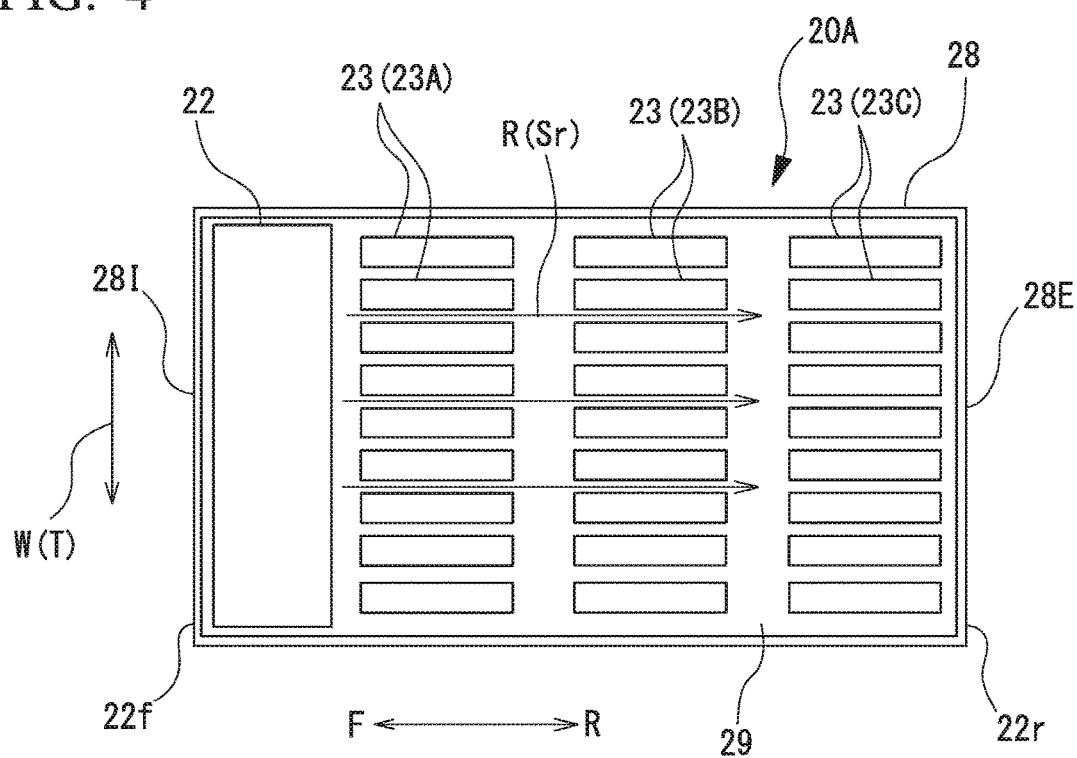
FIG. 4 is a plan view showing a configuration of a server in a third exemplary embodiment of the present invention.

FIG. 4 is a plan view showing a configuration of a server 20A in the third exemplary embodiment of the present invention.

Figure 5:
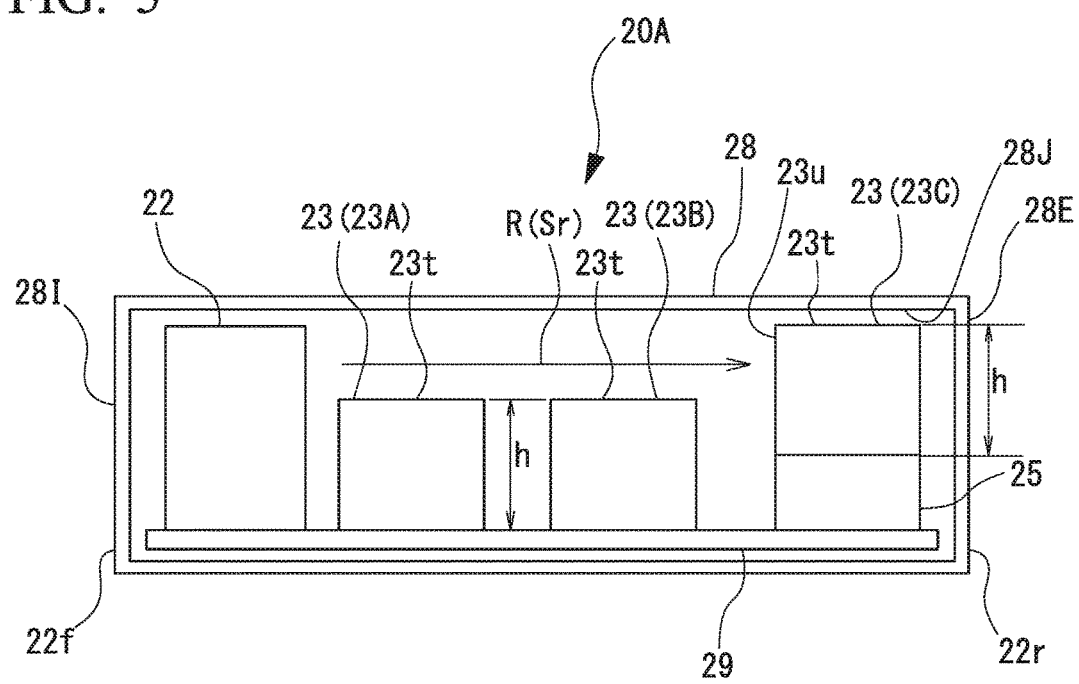
FIG. 5 is a side cross-sectional view showing a configuration of the server in the third exemplary embodiment of the present invention.

FIG. 5 is a side cross-sectional view showing a configuration of the server 20A in the third exemplary embodiment of the present invention.

As shown in FIGS. 4 and 5, the server 20A mainly includes a casing 28, a fan unit (fan) 22, a plurality of server modules (modules) 23, and a support member 25.

The casing 28 houses at least the fan unit 22 and the plurality of server modules 23. The casing 28 has a rectangular shape when viewed from above, and is formed in a box shape that opens upwardly. The casing 28 includes an upper wall portion 28J (refer to FIG. 5) that blocks the opening and, for example, is slidably supported in front and rear directions (directions indicated by FR in FIG. 4) with respect to a rack (not shown in the figure). When the casing 28 is drawn out toward the front from a state where it is housed in the rack, the interior of the casing 28 becomes accessible. On the other hand, when the casing 28 is pushed in toward the rear from a state where it has been drawn out, it is housed in the rack.

There is provided a substrate 29 at the bottom portion of the casing 28. The substrate 29 has a plurality of connectors (not shown in the figure) for electrically connecting to each of the fan unit 22 and the server modules 23.

The fan unit 22 delivers cooling air to the plurality of server modules 23 and cools the respective server modules 23. The fan unit 22 is housed at either one of the end portions in the forward and rear directions of the casing 28. In third exemplary embodiment, exemplified is a case where the fan unit 22 is housed on a front end portion 22f The fan unit 22 delivers cooling air in the front and rear directions of the casing 28. In the third exemplary embodiment, the fan unit 22 has the front end portion 22f side of the casing 28 as an inlet port 28I and a rear end portion 22r side as an exhaust port 28E, and delivers cooling air from the front end portion 22f toward the rear end portion 22r. Consequently, a flow passage R of cooling air is formed within the casing 28 from the inlet port 28I toward the exhaust port 28E (the flow passage R extends from the inlet port 28I toward the exhaust port 28E).

The fan unit 22 may also be configured by a plurality of fan modules (not shown in the figure) aligned in the width direction of the casing 28 (direction indicated by "W" in FIG. 4).

The plurality of server modules 23 are arranged within the casing 28 while leaving a spacing in the front and rear directions. In the third exemplary embodiment, the plurality of server modules 23 are such that, for example, three rows of server modules 23A, 23B, and 23C are provided within the casing 28 from the inlet port 28I toward the exhaust port 28E.

Further, the modules in each set of the server modules 23A, 23B, and 23C are arranged within the casing 28 such that they are arranged in parallel, leaving a spacing in a direction that is orthogonal to the flow direction of the cooling air (direction of the arrows indicated by "Sr" in FIG. 4), or in other words, in the width direction (W), which is orthogonal to the front and rear directions within the horizontal plane.

In this manner, flow passages R of the cooling air due to the fan unit 22 are also formed between server modules 23A, 23B, and 23C that are adjacent in the width direction (W), which is orthogonal to the flow direction of the cooling air (Sr).

The server modules 23A, 23B, and 23C each have a rectangular parallelepiped shape, and the thickness direction thereof (direction indicated by "T" in FIG. 4) is matched with the width direction (W) of the casing 28, which is orthogonal to the flow direction Sr of the cooling air. In the third exemplary embodiment, the server modules 23A, 23B, and 23C have the same height dimension h (refer to FIG. 5).

The bottom portions of the respective server modules 23A, 23B, and 23C are provided with a module-side connector (not shown in the figure) for electrically connecting to the connectors (not shown in the figure) provided on the substrate 29.

The support members 25 support the server modules 23C among the plurality of server modules 23. The support members 25 support the server modules 23C such that the server modules 23C protrude in a direction that is approximately orthogonal to the flow passage R with respect to the other server modules 23A and 23B. Here, for example, the support members 25 are provided on the lower side of the server modules 23C that are arranged on the side near the exhaust port 28E of the casing 28. Consequently, the server modules 23C supported by the support members 25 have the upper portions 23u thereof that protrude in a direction (upward in the example of FIG. 5) that is approximately orthogonal to the flow passage R with respect to the server modules 23A and 23B. In this manner, the support members 25 support the server modules 23C, which are arranged on the side near the exhaust port 28E of the flow passage R, at a higher position than the server modules 23A and 23B, which are arranged on the side near the inlet port 28I. Consequently, the upper end portions 23t of the plurality of server modules 23A, 23B, and 23C are such that their heights approach the upper wall portion 28J of the casing 28 (refer to FIG. 5) with approach to the exhaust port 28E.

Here, the upper surfaces of the support members 25 may connect to the module-side connectors (not shown in the figure) provided on the bottom portions of the server modules 23C, and the lower surfaces of the support members 25 may connect to substrate-side connectors (not shown in the figure) provided on the substrate 29.

According to the third exemplary embodiment described above, as a result of being supported by the support members 25, upper portions 23u of the server modules 23C protrude further than the server modules 23A and 23B in a direction that is approximately orthogonal to the flow passage R. Cooling air having a low temperature that passes above the server modules 23A and 23B and is not used for cooling the server modules 23A and 23B directly hits the upper portions 23u of the server modules 23C. Consequently, the upper portions 23u of the server modules 23C are efficiently cooled, and as a result of the cooling, the server modules 23C are cooled as a whole.

Consequently, it becomes possible to cool the plurality of server modules 23A, 23B, and 23C more uniformly.

Further, while using server modules 23A, 23B, and 23C having the same height dimension h, and without changing the height dimension of the server modules 23A, 23B, and 23C themselves, it is possible for the upper portions 23u of the server modules 23C to protrude in a direction that is approximately orthogonal to the flow passage R by using the support members 25. Therefore, it is possible to inhibit increases in the types of server modules 23A, 23B, and 23C and to inhibit cost increases.

In addition, the upper end portions 23t of the server modules 23A, 23B, and 23C are such that the closer to the exhaust port 28E, the closer they become to the upper wall portion 28J of the casing 28. Consequently, the space of the flow passage R formed by the casing 28, wherein cooling air flows from the inlet port 28I toward the exhaust port 28E, can be used efficiently.

Further, cooling air also flows in the flow passages R formed between the server modules 23A, 23B, and 23C that are adjacent in the width direction (W), which is orthogonal to the flow direction (Sr) of the cooling air. Therefore, the cooling air can be kept from changing direction within the flow passage R in the height direction of the server modules 23A, 23B, and 23C. Consequently, it is possible to inhibit cooling air that has been heated by the server modules 23A and 23B on the side near the inlet port 28I from being supplied to the server modules 23C that are arranged at the exhaust port 28E.

Further, the server modules 23A, 23B, and 23C are arranged such that the thickness direction (T) thereof becomes the width direction (W), which is orthogonal to the flow direction (Sr) of the cooling air. Consequently, the duration in which the server modules 23A, 23B, and 23C and the cooling air perform heat exchange can be made long. Therefore the server modules 23A, 23B, and 23C can be efficiently cooled.

Modification to Third Exemplary Embodiment

Figure 6:
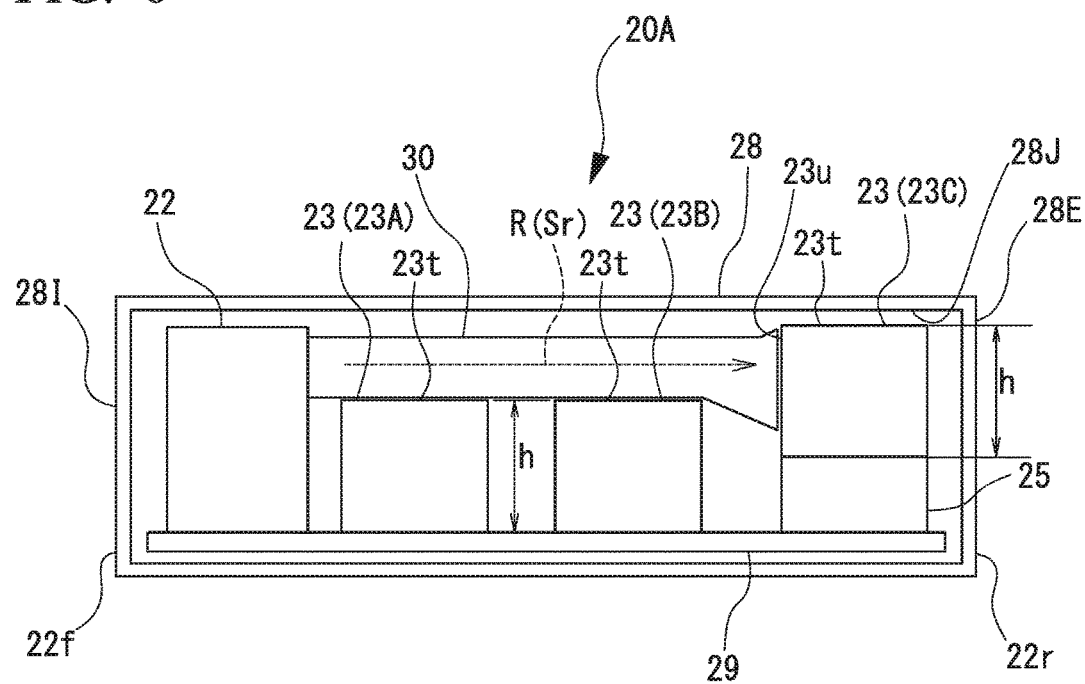
FIG. 6 is a side cross-sectional view showing a modification of the server in the third exemplary embodiment of the present invention.

FIG. 6 is a side cross-sectional view showing a modification of the server 20A in the third exemplary embodiment of the present invention.

As shown in FIG. 6, the server 20A may include a duct 30. The duct 30 directly delivers cooling air from the fan unit 22 to the server modules 23C on the side near the exhaust port 28E, whose upper portions 23u protrude upwardly.

In this manner, by using the space between the server modules 23A and 23B and the upper wall portion 28J, the upper portion 23u of the server module 23C can be more efficiently cooled.

Fourth Exemplary Embodiment

Figure 7:
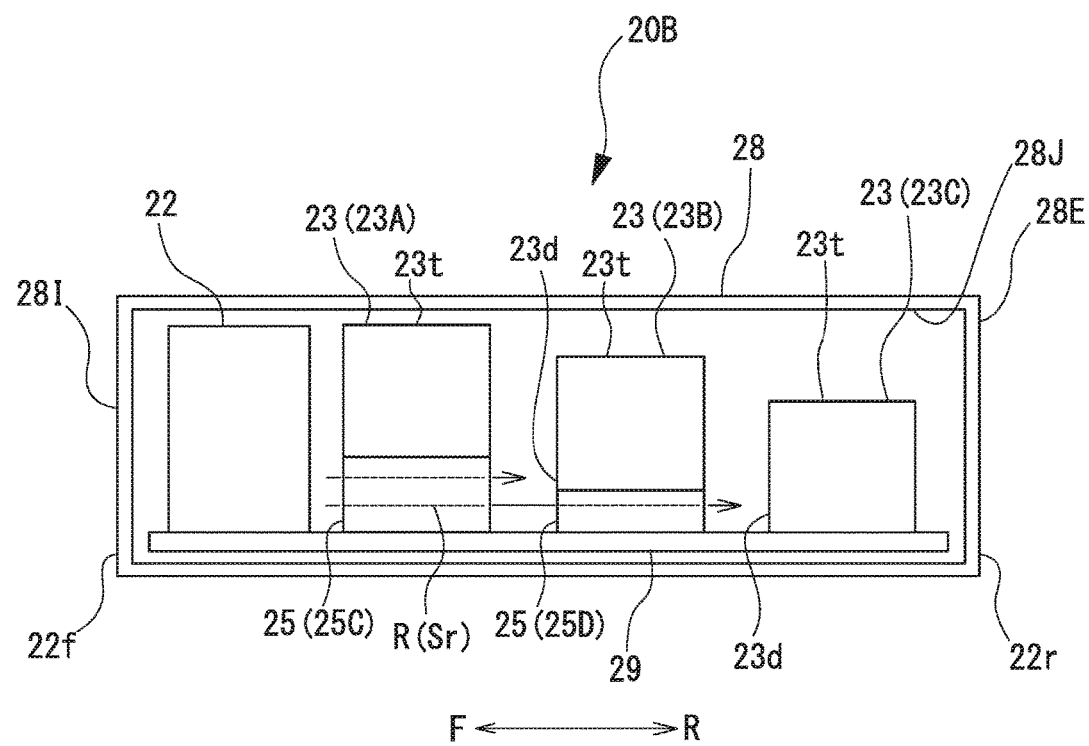
FIG. 7 is a side cross-sectional view showing a configuration of a server in a fourth exemplary embodiment of the present invention.

FIG. 7 is a side cross-sectional view showing a configuration of a server 20B in a fourth exemplary embodiment of the present invention.

As shown in FIG. 7, the server 20B mainly includes, in the same manner as the server 20A in the third exemplary embodiment described above, a casing 28, a fan unit 22, a plurality of server modules 23, and support members 25.

Further, in the fourth exemplary embodiment, in the same manner as in the third exemplary embodiment, the plurality of server modules 23 are such that, for example, three rows of server modules 23A, 23B, and 23C are provided within the casing 28 from the inlet port 28I toward the exhaust port 28E.

The support members 25 support the server modules 23A and 23B among the plurality of server modules 23. In the fourth exemplary embodiment, for example, the support members 25 are provided on the lower side of the server modules 23A and 23B that are arranged on the side near the inlet port 28I of the casing 28.

The support members 25 are formed such that they become higher as they approach the inlet port 28I. That is to say, the heights of support members 25C and 25D that support the plurality of server modules 23A and 23B are mutually different, and are formed such that the support members 25C that support the server modules 23A, which are closest to the inlet port 28I, become higher than the support members 25D that support the server modules 23B.

The support members 25C support the server modules 23A, which are arranged on the side of the flow passage R near the inlet port 28I, such that the server modules 23A become a higher position than the server modules 23B and 23C, which are arranged on the side near the exhaust port 28E. The support member 25D supports the server module 23B such that it becomes a higher position than the server module 23C, which is arranged on the side near the exhaust port 28E. In other words, the support members 25C support such that the lower portions 23d of the server modules 23B and 23C downwardly protrude in a direction that is approximately orthogonal to the flow passage R with respect to the server modules 23A. The support members 25D support such that the lower portions 23d of the server modules 23C downwardly protrude in a direction that is approximately orthogonal to the flow passage R with respect to the server modules 23B.

The support members 25C and 25D support the server modules 23A and 23B, which are arranged on the side of the flow passage R near the inlet port 28I, in positions higher than the server modules 23C that are arranged on the side near the exhaust port 28E. Consequently, the upper end portions 23t of the plurality of server modules 23A, 23B, and 23C are such that their heights approach the upper wall portion 28J of the casing 28 with approach to the inlet port 28I.

In such a configuration, the cooling air supplied from the fan unit 22 flows along the flow passage R formed between the server modules 23A, 23B, and 23C that are adjacent in the width direction (W). In other words, with respect to each of the server modules 23A, 23B, and 23C, cooling air flow along the flow passage R on both width direction sides thereof. At this time, the cooling air that flows along the flow passage R on both width direction sides of the support members 25C and 25D, which support the server modules 23A and 23B arranged on the side near the inlet port 28I, is not used in the cooling of the server modules 23A and 23B and maintains a low temperature state. The cooling air hits the lower portions 23d of the server modules 23C on the side near the exhaust port 28E, which downwardly protrude further than the server modules 23A and 23B, and it cools the lower portions 23d of the server modules 23C.

According to the fourth exemplary embodiment mentioned above, by supporting with the support members 25, the lower portions 23d of the server modules 23C downwardly protrude in a direction that is approximately orthogonal to the flow passage R, with respect to the server modules 23A and 23B. The section of the server module 23C that downwardly protrudes in the direction that is approximately orthogonal to the flow passage R can have delivered thereto cooling air having a low temperature that has not been used in cooling the other server modules 23A and 23B on the upstream side.

Consequently, it becomes possible to more uniformly cool the plurality of server modules 23A, 23B, and 23C.

(Modification of Fourth Exemplary Embodiment)

Figure 8:
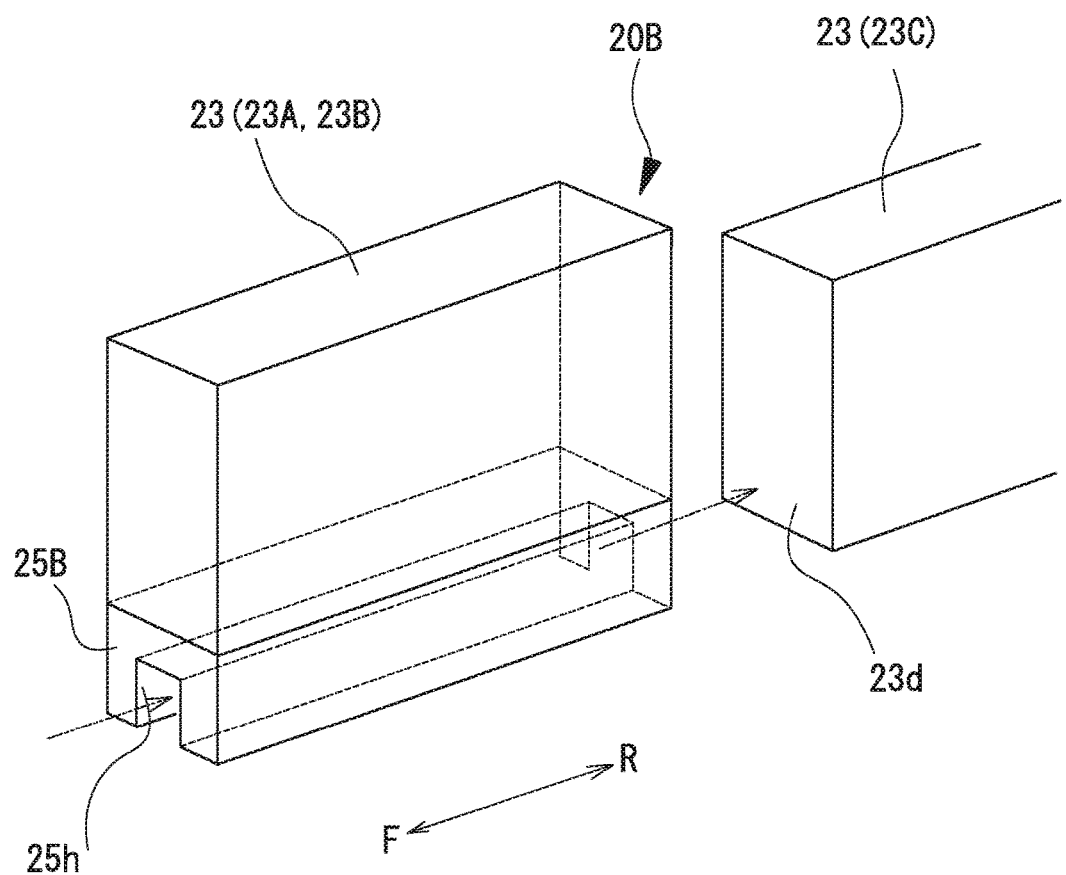
FIG. 8 is a perspective view showing a modification of a support member that configures the server in the fourth exemplary embodiment of the present invention.

FIG. 8 is a perspective view showing a modification of a support member that configures the server 20B in the fourth exemplary embodiment of the present invention.

As shown in FIG. 8, a support member 25B may have a passage 25h that is continuous in the front and rear directions (FR), which represents the flow direction of the cooling air in the flow passage R.

With this configuration, a portion of the cooling air that is supplied from the fan unit 22 passes through the passage 25h of the support member 25B. The cooling air that passes through the passage 25h is not used in the cooling of the server modules 23A and 23B, and maintains a low temperature state. As a result of the cooling air hitting the lower portion 23d of the server module 23C on the side near the exhaust port 28E, which downwardly protrudes further than the server modules 23A and 23B, the server module 23C is cooled.

In the exemplary embodiments described above, a plurality of modules 3 and server modules 23 are provided. The modules 3 may have any functionality, and the server module 23 may be other modules having other functionalities.

In the exemplary embodiments described above, the fan 2 and the fan unit 22 are arranged on the upstream side (side near the inlet port 28I) of the flow passage R. However, they may be arranged on the downstream side (side near the exhaust port 28E) and the like, or at another position.

In addition, the configurations provided in the foregoing exemplary embodiments may be selectively omitted or appropriately changed to other configurations within a scope that does not depart from the gist of the present invention.

What is claimed is:

1. An electronic apparatus comprising:
    a fan which flows cooling air in a flow passage;
    a plurality of modules which are arranged in the flow passage, the modules including first, second, and third modules, the first, second, and third modules being aligned with a flow direction of the cooling air;
    a first support member that supports the first module, and makes a portion of the first module protrude upward relative to the second module in a direction approximately orthogonal to the flow direction; and
    a second support member that supports the second module, and makes a portion of the second module protrude upward relative to the third module in the direction approximately orthogonal to the flow direction,
    wherein the first module is arranged on an inlet side of the flow passage, the second module is arranged between the first module and the third module in the flow direction, and the third module is arranged on an exhaust side of the flow passage, and
    a height of the first support member is higher than a height of the second support member.

2. The electronic apparatus according to claim 1, wherein the first support member includes a passage through which the cooling air passes.

3. The electronic apparatus according to claim 1, wherein the first, second, and third modules have an approximately same height as each other in the direction approximately orthogonal to the flow direction.

4. A server comprising: the electronic apparatus according to claim 1; and a casing that houses the first, second, and third modules, and forms the flow passage.

5. The server according to claim 4, wherein the first support member makes the first module be closer to an upper wall of the casing than the second and third modules are.

6. The server according to claim 4, wherein the first support member makes the first module to be a higher position than the second and third modules.

7. The server according to claim 4, wherein the plurality of modules further includes a fourth module, the second and fourth modules are aligned with the direction orthogonal to the flow direction, and the cooling air passes through a space between the second and fourth modules.

8. The server according to claim 4, wherein a thickness direction of the plurality of modules agrees with a direction perpendicular to the flow direction.

* * * * *